(12) United States Patent
Schwarz

(10) Patent No.: US 6,815,951 B2
(45) Date of Patent: Nov. 9, 2004

(54) MAGNETIC RESONANCE APPARATUS WITH MULTIPLE MICROPHONES FOR IMPROVING CLARITY OF AUDIO SIGNALS FOR A PATIENT

(75) Inventor: Andrea Schwarz, Buckenhof (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/272,849

(22) Filed: Oct. 16, 2002

(65) Prior Publication Data
US 2003/0071624 A1 Apr. 17, 2003

(30) Foreign Application Priority Data
Oct. 16, 2001 (DE) .......................................... 101 51 033

(51) Int. Cl.[7] .................................................. G01V 3/00
(52) U.S. Cl. ....................................................... 324/307
(58) Field of Search ................................ 324/307, 309, 324/318, 322, 300; 600/410

(56) References Cited

U.S. PATENT DOCUMENTS

| | | | |
|---|---|---|---|
| 4,651,099 A | 3/1987 | Vinegar et al. | |
| 4,696,030 A | * 9/1987 | Egozi | 379/167.01 |
| 4,981,137 A | 1/1991 | Kondo et al. | |
| 5,133,017 A | * 7/1992 | Cain et al. | 381/71.6 |
| 5,313,945 A | * 5/1994 | Friedlander | 600/410 |
| 5,384,537 A | * 1/1995 | Ito et al. | 324/318 |
| 5,427,102 A | * 6/1995 | Shimode et al. | 600/410 |
| 5,471,538 A | 11/1995 | Sasaki et al. | |
| 5,552,708 A | * 9/1996 | Ham | 324/318 |
| 5,699,480 A | 12/1997 | Martin | |
| 5,877,732 A | * 3/1999 | Ziarati | 345/8 |
| 6,218,836 B1 | 4/2001 | Vrijheid | |
| 6,463,316 B1 | * 10/2002 | Brungart | 600/410 |

* cited by examiner

Primary Examiner—Diego Gutierrez
Assistant Examiner—Dixomara Vargas
(74) Attorney, Agent, or Firm—Schiff Hardin LLP

(57) ABSTRACT

A magnetic resonance apparatus has a first microphone that is arranged to pick up acoustic signals emanating from a patient positioned for an examination in the magnetic resonance apparatus, at least one second microphone that is arranged so that it is as free as possible from picking up the acoustic signals, and a processing unit to which the signals of the microphones are fed, and with which noise of the magnetic resonance apparatus, also picked up by both microphones, is eliminated for the purpose of extracting the acoustic signals.

15 Claims, 3 Drawing Sheets

MAGNETIC RESONANCE APPARATUS WITH MULTIPLE MICROPHONES FOR IMPROVING CLARITY OF AUDIO SIGNALS FOR A PATIENT

BACKGROUND OF THE INVENTION

1. Field of the Invention

The invention relates to a magnetic resonance apparatus.

2. Description of the Prior Art

Magnetic resonance technology is a known technique for obtaining images of the body interior of an object to be examined. Rapidly switched gradient fields that are produced by a gradient system are superimposed in a magnetic resonance apparatus on a static basic magnetic field that is produced by a basic field magnet system. The magnetic resonance apparatus also has a radio-frequency system that emits radio-frequency signals into the object to be examined in order to trigger magnetic resonance signals, and picks up the triggered magnetic resonance signals, on the basis of which magnetic resonance images are generated.

The magnetic resonance signals are electromagnetic signals in the radio-frequency range, their exact wavelength range being a function of the strength of the basic magnetic field. For the reception, and thus for the magnetic resonance images not to be influenced by external radio-frequency interference as far as possible, it is customary in magnetic resonance technology for at least the actual basic field magnet of the basic field magnet system, a gradient coil system of the gradient system and antennas of the radio-frequency system to be arranged in a shielding cabin. In this case, the shielding cabin forms an uninterrupted enclosure of the above components of the magnetic resonance apparatus, having an attenuation, for example, of at least 90 dB for a frequency band from 10 to 200 MHz, and is, apart from windows, constructed from sheet steel or a copper foil, for example. Of course, the shielding cabin also develops its shielding effect in the reverse direction from inside outward. One embodiment of a shielding cabin is described in U.S. Pat. No. 4,651,099, the shielding cabin being constructed from ferromagnetic metal for the purpose of additional shielding, for example shielding a stray field of the basic field magnet from the outside.

Because a gradient amplifier for supplying the gradient coil system, and a control system, downstream of the antennas, of the radio-frequency system, are arranged outside the shielding cabin, connecting lines, for example between the gradient coil system and the gradient amplifier, are fed through via filters integrated in the shielding cabin, so that no radio-frequency interference can reach the shielding cabin. An embodiment such a filter is described in U.S. Pat. No. 6,218,836.

Appropriate currents need to be set in gradient coils of the gradient coil system in order to produce gradient fields. Amplitudes of the required currents are up to several 100 A. The current rise and fall rates are up to several 100 kA/s. Given the presence of a basic magnetic field on the order of magnitude of 1 T, these temporally varying currents in the gradient coils are acted on by Lorentz forces that lead to mechanical vibrations of the gradient coil system. These vibrations are passed on to the surface of the magnetic resonance apparatus via various propagation paths. There, the mechanical vibrations are converted into acoustic vibrations that finally lead to noise, which is undesired per se. Peak values of more than 125 dB are reached.

When an examination begins, a patient capable of normal reactions is given a pushbutton which, if activated during the examination, signals the occurrence of a problem to an operator working at a display and operating device of the magnetic resonance apparatus arranged outside the shielding cabin. Because it is advantageous to have the option of closer communication between the patient and the operator, is it known, for example, from German PS 195 24 847 to transmit to the operator acoustic signals coming from the patient. For this purpose German PS 195 24 847 discloses a device in which the effect of interference on the transmission quality is reduced. In this case, the device is constructed with at least two microphones, signals picked up by the microphones having a speech signal component and a disturbing noise component. The processing of the microphone signals is undertaken in this case with the aim of reducing the disturbing noise component in three frequency sub-bands. In a middle frequency band, the signal is weighted with a scalar factor such that this frequency band is damped during the speech pauses; the scalar weighting in the middle frequency band is set up on the basis of an estimated signal-to-noise ratio. In an upper frequency band, use is made of an adaptive filter that is calculated in a device by averaging from two filters adapted in terms of linear phase, the coefficients being spectrally smoothed. At the start of the processing an increase of the signal levels is performed that is cancelled again by an inverse filter before the output of the improved signal.

SUMMARY OF THE INVENTION

An object of the present invention is to provide an improved magnetic resonance apparatus with which acoustic signals coming from a patient being examined can be picked up in such a way that these signals can be freed from noise of the magnetic resonance apparatus also picked up.

The object is achieved according to the invention in a magnetic resonance apparatus having a first microphone that is arranged to pick up acoustic signals coming from a patient supported for an examination in the magnetic resonance apparatus, at least one second microphone that is arranged so that it is as free as possible from picking up the acoustic signals, and a processing unit to which the signals of the microphones are fed, which eliminates noise of the magnetic resonance apparatus also picked up, for the purpose of extracting the acoustic signals.

The described arrangement of the two microphones ensures that the acoustic signals from the patient, despite the very loud noise of the magnetic resonance apparatus superimposed on the acoustic signals, can be picked up, transmitted and, for example, made available to an operator of the magnetic resonance apparatus in a way that is clear and distinct and freed of noise.

In an embodiment, the processing unit includes a subtractor with the aid of which the two microphone signals can be subtracted from one another such that the noise of the magnetic resonance apparatus also picked up is eliminated for the purpose of extracting the acoustic signals from the patient.

Owing to the different attachment locations of the microphones, the noise picked up by the two microphones, from the magnetic resonance apparatus can differ in the microphone signals. In an embodiment the signal from the second microphone is filtered upstream of the subtraction with the aim of fitting it as closely as possible to the noise picked up by the first microphone.

Since the difference between the noise included in the two microphone signals is not determined exclusively by the attachment sites of the two microphones, but is also a function of the particular surroundings of where the magnetic resonance apparatus is set up, and of the acoustics associated therewith, the filtering can advantageously be carried out with an adaptive filter.

DESCRIPTION OF THE PREFERRED EMBODIMENTS

Figure 1:
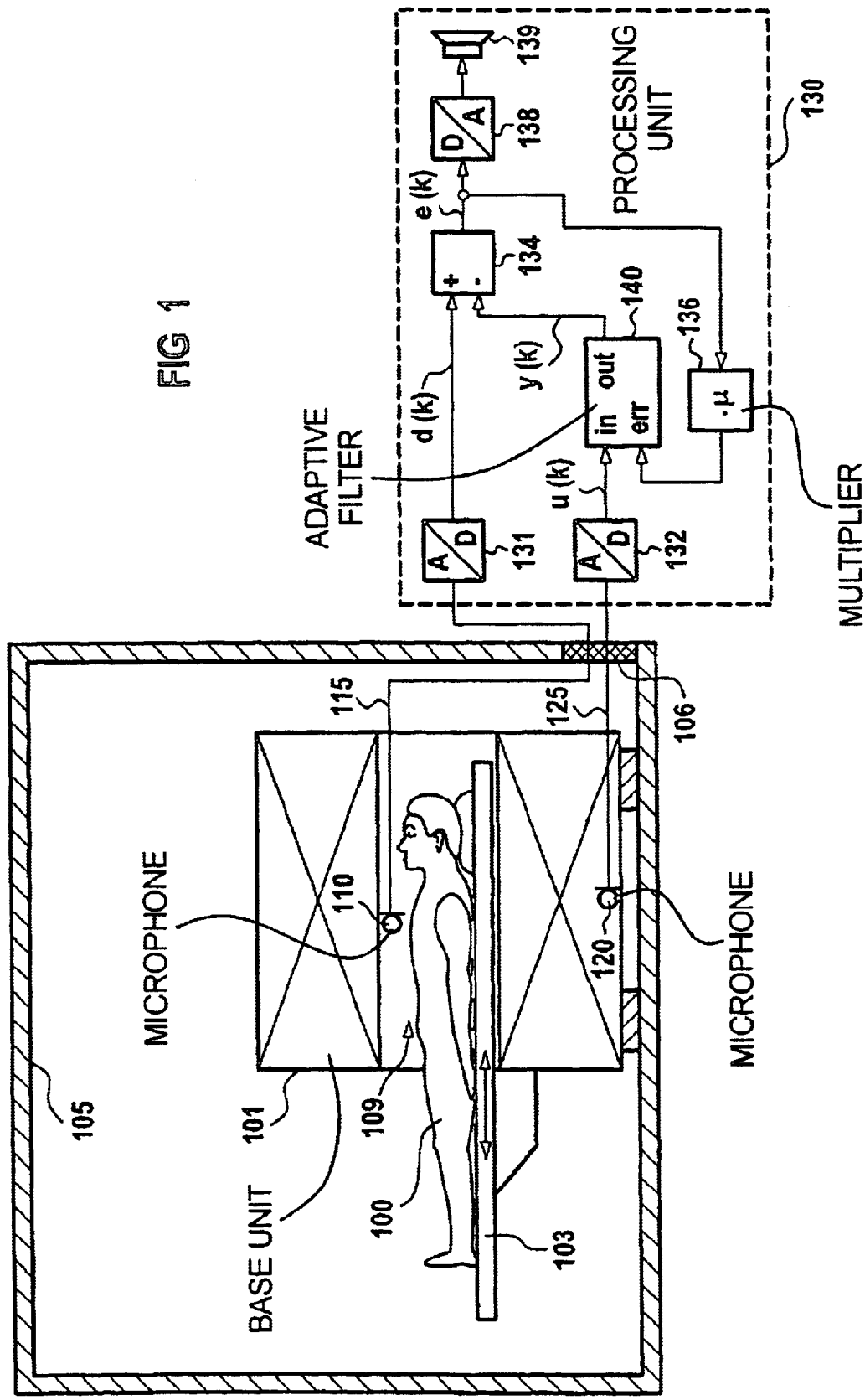
FIG. 1 is a block diagram of a magnetic resonance apparatus having two microphones and a processing unit with an adaptive filter, in accordance with the invention.

FIG. 1 shows, as an exemplary embodiment of the invention, a sketch of a magnetic resonance apparatus having a first microphone 110 and a second microphone 120. The magnetic resonance apparatus has a substantially hollow cylindrical base unit 101 with a cavity in which a patient holding space 109 is disposed. The base unit 101 contains a superconducting basic field magnet for producing a static basic magnetic field, a permanently installed gradient coil system for producing gradient fields, and a likewise permanently installed antenna system for transmitting radio-frequency signals and for receiving magnetic resonance signals. The magnetic resonance apparatus also has a movable patient support device 103 fastened on the base unit 101 for the purpose of introducing a patient 100 into the patient holding space 109.

The first microphone 110 is arranged in the patient holding space 109 for the purpose of picking up acoustic signals that emanate from the patient 100 supported in the patient holding space 109. In addition to the acoustic signals from the patient 100, this first microphone 110 necessarily also picks up the noise emanating from the magnetic resonance apparatus during operation thereof. The second microphone 120 is arranged at the outer lateral cylinder surface of the base unit 101 for the purpose of picking up, as far as possible, only the aforementioned noise from the magnetic resonance apparatus without the acoustic signals from the patient 100. In other designs, the second microphone 120 can be located below the patient support device 103, above on the outer lateral cylinder surface of the base unit 101 or on an encapsulation facing the basic field magnet, and/or there can be an arrangement using a directional characteristic of the second microphone 120 when it is constructed as a directional microphone. It may be particularly required in this case during the practical implementation to optimize the position of the second microphone 120 by experiment.

The base unit 101 together with the patient support device 103 and the two microphones 110 and 120 are arranged in a shielding cabin 105. In this case, connecting lines 115 and 125 of the two microphones 110 and 120 are fed through via a filter plate 106 integrated in the shielding cabin 105 so that no radio-frequency interference can reach the shielding cabin 105 from outside via the connecting lines 115 and 125. Starting from the filter plate 106, the connecting lines 115 and 125 are proceeding to a processing unit 130 arranged at a display and operating station of the magnetic resonance apparatus.

The processing unit 130 in this case has a first analog-to-digital converter 131 that is supplied with the analog signal of the first microphone 110, which includes both the acoustic signals from the patient 100 and the noise originating from the magnetic resonance apparatus, for the purpose of conversion into a digital signal d(k). The processing unit 130 also has a second analog-to-digital converter 132 that is supplied with the analog signal of the second microphone 120, which includes, if possible, only the noise caused by the magnetic resonance apparatus, for the purpose of conversion into a digital signal u(k). The signal u(k) of the second microphone 120 is supplied to a digital adaptive filter 140 of the processing unit 130. The processing unit 130 also has a digital subtractor 134 that, for the purpose of forming a digital output signal (e) k as the difference between the signal d(k) of the first microphone 110 and a digital output signal y(k) of the filter 140, is fed the last-named two signals d(k) and y(k) as input signals. In this case, on the one hand, the output signal e(k) of the subtractor 134 is supplied with via a digital-to-analog converter 138 to a loudspeaker 139 of the processing unit 130 for emitting the acoustic signals from the patient 100, for example for an operator of the magnetic resonance apparatus working at the display and operating station. The output signal e(k) also is supplied to the filter 140 as a further input signal via a multiplier 136, with which the output signal e(k) is multiplied by an adaptation factor $\mu$.

As a result of the different attachment locations of the microphones 110 and 120, and depending on the respectively prevailing acoustics of the surroundings in the shielding cabin 105 where the magnetic resonance apparatus has been installed, the noise picked up from the magnetic resonance apparatus by the two microphones 110 and 120 is not identical. The task of the filter 140 in this case is to adapt the noise picked up by the second microphone 120 to the noise contained in the signal of the first microphone 110 so that the output signal e(k) of the subtractor 134 includes, if possible, only the acoustic signals from the patient 100, and so that the noise from the magnetic resonance apparatus is cancelled by subtraction.

For this purpose, filter coefficients $c_0(k)$ to $c_N(k)$ of the filter 140 are calculated iteratively in the filter 140 in order to minimize an average power of the signal e(k). The filter 140 operates in this case using a method minimizing the error squares. Here, the filtering acts exclusively on the noise from the magnetic resonance apparatus contained in the signals, and not on the acoustic signals from the patient 100. The reason for this is that, although the signal d(k) includes both the noise from the magnetic resonance apparatus and the acoustic signals from the patient 100, these two components are not correlated with one another, and the signal u(k) includes only the noise that is correlated with the noise included in the signal d(k). Thus only the components that are correlated with one another, i.e., the noise from the magnetic resonance apparatus, are influenced by the filter 140, whereas the acoustic signals from the patient 100, which are not correlated with the noise, remain uninfluenced by the filter 140.

The adaptation factor $\mu$ of the multiplier 136 affects how quickly preceding iteration steps are disregarded. A small value of the adaptation factor $\mu$ leads in this case to a more accurate, but slower, adaptation of the filter 140, whereas a large value leads to a fast, but less accurate, adaptation. The adaptation factor $\mu$ is typically in a range of values between zero and two in this case.

The following relationships apply for the signals d(k), e(k), u(k) and y(k) denoted in the processing unit 130:

$$y(k) = \underline{c}^T(k-1)\underline{u}(k),$$

$$\underline{c}(k)=\underline{c}(k-1)+\mu.e(k).\underline{u}(k) \text{ and}$$
$$e(k)=d(k)-y(k)$$

$$\text{where } \underline{c}(k) = \begin{pmatrix} c_0(k) \\ c_1(k) \\ \vdots \\ c_N(k) \end{pmatrix} \text{ and } \underline{u}(k) = \begin{pmatrix} u(k) \\ u(k-1) \\ \vdots \\ u(k-N) \end{pmatrix} \text{ where } N \in \mathbb{N}.$$

Here, k designates the respective iteration step from the set of whole numbers, and N designates as an even-numbered value greater than zero, the order of the filter 140 with the filter coefficients $c_0(k)$ to $c_N(k)$, that are noted in the vector $\underline{c}(k)$.

The processing unit 130 together with the converters 131, 132 and 138, the adaptive filter 140, the subtractor 134, the multiplier 136 and the speaker 139 can be constructed as an integrated unit or as several separate components, or can have access to devices of the display and operating station, for example an installation computer, and/or can be integrated therein. For example, the installation computer can have a sound card with inputs connected to the connecting lines 115 and 125, the further processing of the signals originating from the microphones 110 and 120 then being performed in the installation computer.

Figure 2:
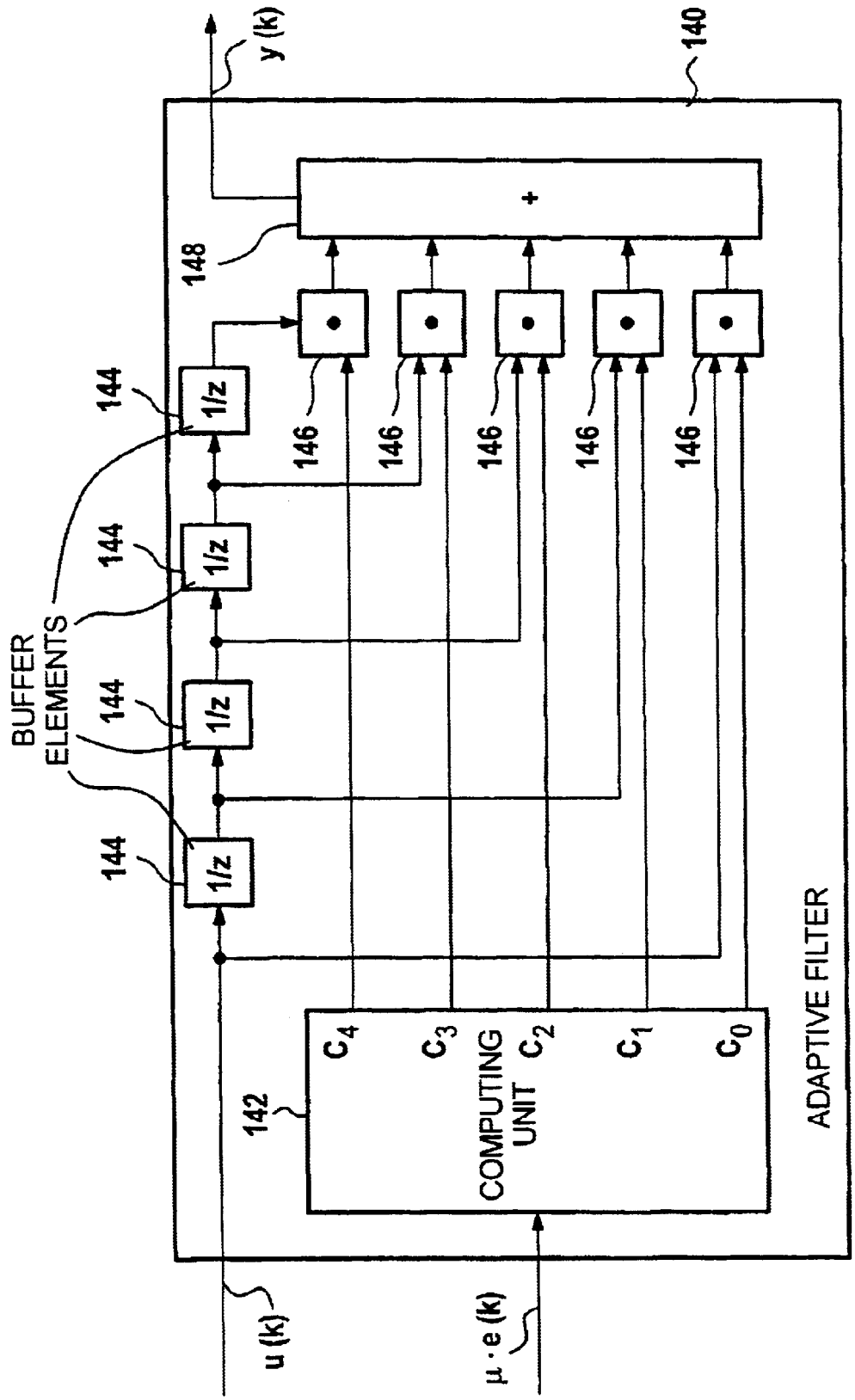
FIG. 2 is a detailed block diagram of the adaptive filter.

FIG. 2 shows, as an exemplary embodiment, a block diagram of the adaptive filter 140 of FIG. 1 as a fourth-order filter. Here, the filter 140 has four buffer elements 144 for buffering four values of the signal u(k) in accordance with the values in vector $\underline{u}(k)$ where N=4, so that it is possible for the filter coefficients $c_0(k)$ to $c_4(k)$ of the coefficient vector $\underline{c}(k)$ to be calculated iteratively in a coefficient computing unit 142, and for the output signal y(k) to be calculated iteratively in accordance with the above equations. Here, the function of the buffer elements 144 is indicated by 1/z, z being the complex variable of the z-transform of u(k). The filter 140 also has five further multipliers 146 and a summation unit 148 in order to implement the above equations.

Figure 3:
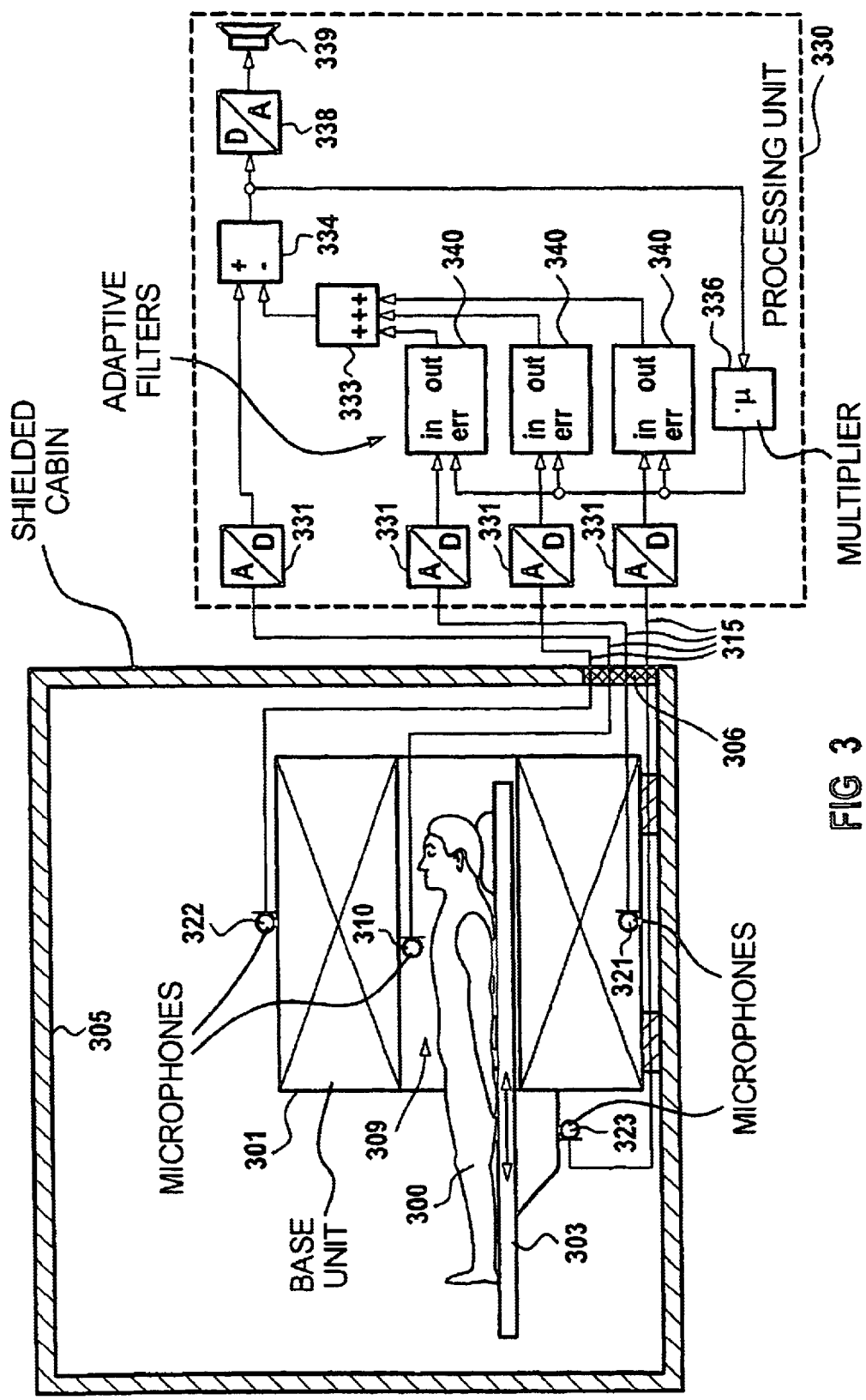
FIG. 3 is a block diagram of a magnetic resonance apparatus having four microphones and a processing unit with adaptive filters, in accordance with the invention.

FIG. 3 shows as a further exemplary embodiment of the inventive magnetic resonance apparatus having four microphones 310, 321, 322 and 323. The magnetic resonance apparatus has, as in FIG. 1, a base unit 301 and a moveable patient support device 303 for a patient 300.

A first microphone 310 is arranged in the patient holding space 309 for the purpose of picking up acoustic signals that emanate from the patient 300 supported in the patient holding space 309. In addition to the acoustic signals from the patient 300, this first microphone necessarily also picks up the noise emanating from the magnetic resonance apparatus during operation thereof. Three further microphones 321, 322 and 323 are arranged at the magnetic resonance apparatus for the purpose of picking up, as far as possible, only the aforementioned noise from the magnetic resonance apparatus without the acoustic signals from the patient 300. A second microphone 321 is arranged in this case, as in FIG. 1, below at the outer lateral cylinder surface of the base unit 301, a third microphone 322 is arranged above at the lateral cylinder surface, and a fourth microphone 323, constructed as a directional microphone, is arranged below the patient support device 303.

The four connecting lines 315 of the microphones 310, 321, 322 and 323 are fed through via a filter plate 306 of a shielding cabin 305 of the magnetic resonance apparatus to a processing unit 330 having four analog-to-digital converters 331, three digital adaptive filters 340, a digital summation unit 333, a digital subtractor 334, a digital multiplier 336, a digital-to-analog converter 338 and a speaker 339.

The filter coefficients are determined separately in this case in the filters 340 for each of the three microphones 321, 322 and 323. Here, the processing unit 330 differs from that of FIG. 1 only by the use of three filters 340 for the signals of the microphones 321, 322 and 323 instead of one filter 140. The output signals of the filters 340 are added by the summation unit 333 before being fed to the subtractor 334. Otherwise, the description relating to FIG. 1 applied to FIG. 2.

The adaptive filtering is further improved by the two additional microphones 322 and 323, because further components, not detectable by the second microphone 321, of the noise from the magnetic resonance apparatus can be detected. An even better response to the acoustics of the particular space environment is achieved.

Although modifications and changes may be suggested by those skilled in the art, it is the intention of the inventor to embody within the patent warranted hereon all changes and modifications as reasonably and properly come within the scope of her contribution to the art.

I claim as my invention:

1. A magnetic resonance apparatus comprising:
    a magnetic resonance examination arrangement which, when operated, generates noise, said magnetic resonance apparatus having a region adapted to receive a patient therein;
    a first microphone disposed relative to said region for picking up acoustic signals emanating from a patient in said region, and also picking up said noise;
    a second microphone disposed relative to said region for picking up substantially none of said acoustic signals, but picking up said noise;
    a processing unit supplied with an output from said first microphone and an output from said second microphone for processing said respective outputs to obtain a processed signal wherein said noise is eliminated and which contains said acoustic signals; and
    said processing unit including an adaptive filter for filtering one of the respective outputs of said first and second microphone, said adaptive filter having filter coefficients which are iteratively set according to an error squares minimization method.

2. A magnetic resonance apparatus as claimed in claim 1 wherein said examination unit has a hollow cylindrical base unit with an outer lateral cylinder surface, and wherein said second microphone is disposed at said outer lateral cylinder surface.

3. A magnetic resonance apparatus as claimed in claim 1 further comprising a patient support mechanism adapted to receive a patient thereon to transport said patient relative to said region, and wherein said second microphone is disposed below said patient support mechanism.

4. A magnetic resonance apparatus as claimed in claim 1 wherein said second microphone is a directional microphone.

5. A magnetic resonance apparatus as claimed in claim 1 wherein said processing unit has a speaker for emitting said acoustic signals in said processed signal.

6. A magnetic resonance apparatus as claimed in claim 1, wherein the output of said second microphone is filtered in said adaptive filter.

7. A magnetic resonance apparatus as claimed in claim 6 wherein said processing unit comprises a subtractor which forms said output signal as a difference between said output of said first microphone and said output of said second microphone after said output of said second microphone is filtered in said adaptive filter.

8. A magnetic resonance apparatus as claimed in claim 7 further comprising a speaker connected to an output of said subtractor for acoustically emitting said acoustic signals in said processed signal.

9. A magnetic resonance apparatus as claimed in claim 7 wherein said processing unit comprises a multiplier connected to an output of said subtractor for multiplying said processed signal by an adaptation factor to produce an error signal, and wherein said multiplier is connected to said adaptive filter and supplies said error signal to said adaptive filter, said adaptive filter adaptively filtering said output of said second microphone dependent on said error signal.

10. A magnetic resonance apparatus as claimed in claim 9 wherein each of said adaptive filter, said subtractor and said multiplier is a digitally operating component.

11. A magnetic resonance apparatus as claimed in claim 9 wherein at least one of said adaptive filter, said subtractor and said multiplier is a digitally operating component.

12. A magnetic resonance apparatus as claimed in claim 1 wherein the respective outputs of said first and second microphones are analog signals, and wherein said processing unit comprises at least one analog-to-digital converter connected to at least one of said first and second microphones for converting at least one of said analog signals into a digital signal.

13. A magnetic resonance apparatus as claimed in claim 1 comprising a plurality, greater than two, of microphones, including said first and second microphones, each microphone in said plurality of microphones having an output supplied to said processing unit, and said processing unit processing the respective outputs of all of said microphones in said plurality of microphones to produce said processed signal.

14. A magnetic resonance apparatus as claimed in claim 1 comprising:
a shielding cabin in which said examination is disposed, for shielding said examination unit relative to electromagnetic fields, a filter plate in said shielding cabin participating in the shielding by said shielding cabin, and respective connecting lines proceeding through said filter plate and connecting said outputs of said first and second microphones to said processing unit.

15. A magnetic resonance apparatus as claimed in claim 14, wherein said processing unit is located outside of said shielding cabin.

* * * * *